United States Patent [19]

Kobayashi

[11] Patent Number: 5,404,051
[45] Date of Patent: Apr. 4, 1995

[54] TOTEM-POLE LOAD DRIVING CIRCUIT WITH POTENTIAL RISE CHARACTERISTICS CONTROL

[75] Inventor: Michiroh Kobayashi, Beppu, Japan

[73] Assignee: Texas Instruments Incorporated, Dallas, Tex.

[21] Appl. No.: 28,512

[22] Filed: Mar. 9, 1993

[30] Foreign Application Priority Data

Mar. 12, 1992 [JP] Japan ................. 4-087977

[51] Int. Cl.⁶ .................................. H03K 6/04
[52] U.S. Cl. ........................... 327/170; 327/73; 327/108; 327/112; 327/482; 327/483
[58] Field of Search ........... 307/254, 315, 359, 443, 307/456, 246, 263, 542, 546, 549, 555, 572, 270

[56] References Cited

U.S. PATENT DOCUMENTS

| | | | |
|---|---|---|---|
| 4,603,268 | 7/1986 | Davis | 307/542 |
| 4,622,482 | 11/1986 | Ganger | 307/263 |
| 4,633,106 | 11/1986 | Backes et al. | 307/270 |
| 4,677,313 | 6/1987 | Mimoto | 307/270 |
| 4,877,975 | 10/1989 | Ueno | 307/555 |
| 4,880,997 | 11/1989 | Steele | 307/263 |
| 4,910,416 | 3/1990 | Salcone | 307/270 |
| 4,972,104 | 11/1990 | Estrada | 307/456 |
| 5,099,138 | 3/1992 | Fukunaga | 307/270 |
| 5,121,000 | 6/1992 | Naghshineh | 307/263 |
| 5,229,660 | 7/1993 | Shiotsu et al. | 307/454 |
| 5,281,862 | 1/1994 | Ma | 307/254 |

FOREIGN PATENT DOCUMENTS

| | | | |
|---|---|---|---|
| 0304016 | 10/1992 | Japan | 307/572 |
| 0009467 | 11/1990 | WIPO | 307/572 |

Primary Examiner—Terry D. Cunningham
Attorney, Agent, or Firm—Richard L. Donaldson; William E. Hiller

[57] ABSTRACT

A transistor load driving circuit characterized in that fast charge/discharge driving can be realized for a capacitive load with variation made between a large load state and a small load state, without breakdown phenomenon for the output transistors. In load driving circuit 1, there is a totem-pole-type load driving circuit 10 and a rise characteristics control circuit 20, which is connected to resistor $C_L$ by coupling capacitor $C_1$ and acts as a constant-current functional circuit. In the case with a large load, said totem-pole-type load driving circuit 10 can perform high-speed charge/discharge operations for the load electrostatic capacitance $C_L$. When the value is small for load electrostatic capacitance $C_L$, the characteristic curve of totem-pole-type load driving circuit 10 becomes too steep, so that the sustain voltage of the transistor decreases, rise characteristics control circuit (20) acts to limit the collector potential of phase-splitting transistor $Q_3$, the operation of transistors $Q_3$, $Q_4$ is delayed so that the rise characteristics are tempered to avoid the breakdown phenomenon of the transistors.

6 Claims, 3 Drawing Sheets

TOTEM-POLE LOAD DRIVING CIRCUIT WITH POTENTIAL RISE CHARACTERISTICS CONTROL

FIELD OF INVENTION

This invention concerns a type of load driving circuit using transistors. In particular, this invention concerns a type of transistor load driving circuit characterized in that even in the case when a very large capacitive load is driven fast, and the load becomes very low with a change in the load, there is still no breakdown phenomenon with a large current flow through the transistors to cause damage to the transistors.

BACKGROUND OF THE INVENTION

FIG. 8 shows the configuration of a totem-pole-type load driving circuit appropriate for high-speed driving of a capacitive load. In FIG. 8, examples of the load shown as load electrostatic capacitance $C_L$ include power MOSFET, CCD, etc.

In the aforementioned conventional totem-pole-type load driving circuit, in order to make charge/discharge driving for load electrostatic capacitance $C_L$, transistor $TR_1$ connected to load electrostatic capacitance $C_L$ and transistor $TR_2$ connected in the Darlington connection to transistor $TR_3$ are turned ON alternately by means of Schottky barrier (SB) transistor $TR_4$ as a phase splitter (for phase splitting).

When transistor $TR_2$ is turned on while transistor $TR_1$ is in the OFF state, charging is carried out from $V_{CC}$ power source to load electrostatic capacitance $C_L$ by transistor $TR_2$; when transistor $TR_1$ is turned ON while transistor $TR_2$ is in the OFF state, discharging is carried out from load electrostatic capacitance $C_L$ to ground GND by transistor $TR_1$.

The charging time to load electrostatic capacitance $C_L$ depends on the rise time $t_r$ defined by the time constant obtained from the pull-up resistance $R_{UP}$, the sum of the resistance R of the resistor element LR connected to the collector of transistor $TR_2$ and the equivalent resistance $TR_2$ of transistor $R_{TR2}$ and load electrostatic capacitance $C_L$.

The discharging time from load electrostatic capacitance $C_L$ depends on drop time $t_d$ defined by the time constant defined by the pull-down resistance $R_{LOW}$, the equivalent resistance $R_{TR1}$ of transistor $TR_1$ and load electrostatic capacitance $C_L$.

A resistor element ER is connected to the base of transistor $TR_1$ so that transistor $TR_1$ can be turned off rapidly.

Recently, there is a demand on the totem-pole-type load driving circuit characterized in that even when a load as large as having a load electrostatic capacitance $C_L$ of 500–2000 pF or larger is to be driven, a delay time $t_{pd}$ as short as about 20–50 nsec can still be guaranteed. That is, there is a demand on the totem-pole-type load driving circuit with high-operational ability for a large capacitive load.

For this purpose, the aforementioned pull-up resistance $R_{UP}$ and the pull-down resistance $R_{LOW}$ have to be as small as several Ω.

The totem-pole-type load driving circuit may have various applications. Depending on the application, the load may be switched from the use state to the no-load state, or the "0" load state may take place.

In order to form a high-speed circuit configuration for the totem-pole-type load driving circuit matched with large load electrostatic capacitance $C_L$, the aforementioned pull-up resistance $R_{UP}$ and the pull-down resistance $R_{LOW}$ are made small. In this case, suppose the capacitive load enters the no-load state, or "0", the rise time $t_r$ becomes too short, the sustain voltage of the transistor is decreased, and breakdown phenomenon takes place, in which a large current flows through transistors $TR_1$, $TR_2$, and the transistors are damaged.

The aforementioned breakdown phenomenon may be analyzed with reference to FIG. 9. FIG. 9 shows the peripheral portion of transistor $TR_1$ of the totem-pole-type load driving circuit shown in FIG. 8.

For the output transistor of the various types of driver devices, transistor $TR_1$ in this example, when the output, namely, the potential of the collector rises at a high speed, the breakdown phenomenon may take place by a current flowing through Miller capacitance $C_M$ defined by base-collector parasitic capacitance $C_{BC}$ between collector C and base B times with gain G of the transistor. The critical voltage (output voltage) that determines whether the breakdown phenomenon takes place is called the "sustain voltage."

It is well known that the aforementioned breakdown phenomenon may take place due to the fast rise of the output voltage due to the reverse electromotive force of the inductive load. It also takes place for the capacitive load.

In the breakdown phenomenon, transistors $TR_1$ and $TR_2$ become primarily ON simultaneously. At the same time, the state in turing ON is repeated for several rounds in a vibrational state. In this case, the excessive current flows to transistor $TR_1$, $TR_2$, and these transistors $TR_1$ and $TR_2$ may be damaged in many cases.

As the burst current flowing into the transistor is high when load electrostatic capacitance $C_L$ is charged, it is impossible to adopt the method of setting a surge current protector circuit in the operation with the breakdown phenomenon, although it has been tried.

In order to prevent the breakdown phenomenon, it is necessary to increase the sustain voltage.

As a method to increase the sustain voltage, the base-open collector yield voltage $BV_{CEO}$ of transistor $TR_1$ may be raised. However, in order to raise the base-open collector yield voltage $BV_{CEO}$, the epitaxial layer of the transistor has to be made thicker.

However, when the epitaxial layer is made thicker, various problems take place, such as an increase in the size of the semiconductor substrate, increase in the dimensions of transistor elements. As the parasitic capacitance is increased, the delay time $t_{pd}$ becomes longer, the driving power becomes higher, and the power consumption is increased. Also, as the parasitic capacitance is increased, the Miller capacitance $C_M$ is increased, and it becomes impossible to perform the high-speed charging/discharging operation for load electrostatic capacitance $C_L$. In addition, the dimensions of the IC chip are increased, and the price is also increased.

Consequently, an increase in the thickness of the epitaxial layer so as to increase the base-open collector yield voltage $BV_{CEO}$ and hence to increase the sustain voltage is not generally regarded as a satisfactory approach for increasing the sustain voltage.

SUMMARY OF THE INVENTION

The purpose of this invention is to solve the aforementioned problems of the conventional methods by providing a type of load driving circuit characterized in that in the application with variation in the capacitive load, a high-speed operation can be realized even when the load state is high, and the high-speed operation can also be realized in the state with a low load, so that the aforementioned breakdown phenomenon can be prevented.

In order to solve the aforementioned problems and to realize the aforementioned purposes, this invention provides a type of load driving circuit characterized in that it consists of a totem-pole-type output circuit made of a first transistor and a second transistor, and a rise characteristics control circuit, which has a coupling circuit connected to the connection point between said first transistor and said second transistor, and which monitors the rise variation in the potential at the aforementioned connection point by the aforementioned coupling circuit, and which dampens the rise characteristics of the aforementioned totem-pole-type output circuit by increasing the turn-on time of the aforementioned first transistor circuit when the aforementioned rise variation of the potential becomes higher than a prescribed level.

The first transistor and the second transistor that form the totem-pole-type output circuit are turned ON alternately, so that the capacitive load with a large load capacitance can be driven at a high speed.

However, when the load becomes lower, the rise characteristic curve may become too steep, causing a decrease in the sustain voltage.

In the rise characteristics control circuit, the rise characteristics of the totem-pole-type output circuit are tempered to prevent a decrease of the sustain voltage of the transistor when the load becomes lower.

As a result, the sustain voltage of the load driving circuit rises, and the breakdown phenomenon of the transistor can be prevented.

In addition, in the rise characteristics control circuit, the rise characteristics of the totem-pole-type output circuit are tempered when the load is low and the input threshold value of the load circuit connected to the totem-pole-type output circuit is passed, and hence an even higher speed operation of the load driving circuit and rise of the sustain voltage of the transistor can be realized simultaneously.

1, load driving circuit
2, control logic circuit
3, power MOSFET
10, totem-pole-type load driving circuit
20, rise characteristics control circuit
$Q_1$, second control transistor
$Q_2$, first control transistor
$Q_3$, phase-splitting SB type transistor
$Q_4$, second transistor
$Q_5$, first transistor
$Q_6$, Darlington connection transistor
$C_1$, coupling capacitor
$C_L$, load electrostatic capacitance
$D_1$, $D_2$, diodes
$R_1$, adjustable resistor element
$R_2$–$R_7$, resistor elements
$I_{C2}$, first control transistor's collect current
$I_{CL}$, load current.

DESCRIPTION OF PREFERRED EMBODIMENTS

Figure 1:
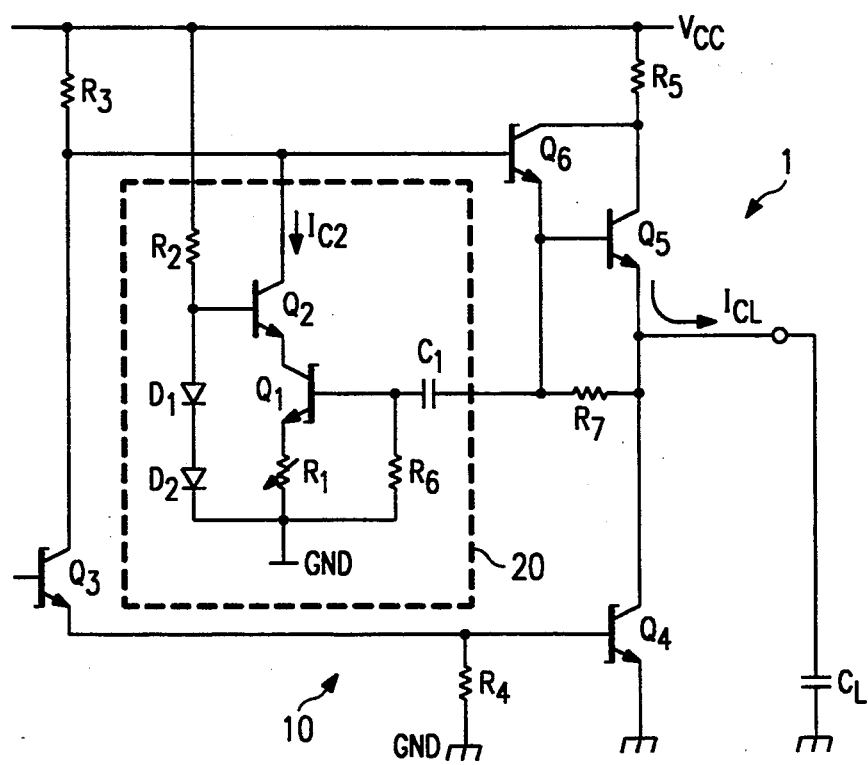
FIG. 1 is a circuit diagram of the totem-pole-type load driving circuit in a first embodiment of the load driving circuit of this invention.

FIG. 1 is a circuit configuration diagram of a first embodiment of the load driving circuit of this invention.

Figure 8:
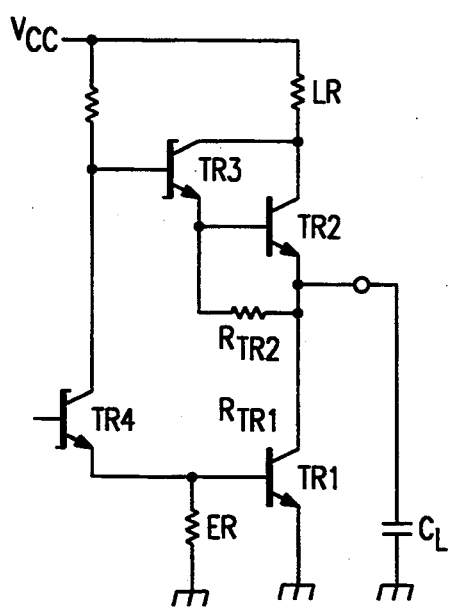
FIG. 8 is a circuit diagram of a conventional totem-pole-type load driving circuit.
Figure 9:
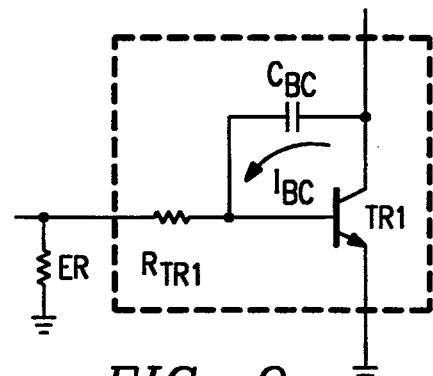
FIG. 9 is a circuit diagram of the periphery of the output transistor in FIG. 8.

In load driving circuit 1 shown in FIG. 1, there is a totem-pole-type load driving circuit 10 similar to the aforementioned totem-pole-type load driving circuit shown in FIG. 8, and a rise characteristics control circuit 20.

Totem-pole-type load driving circuit 10 comprises the following elements: phase-splitter (phase-splitting) Schottky-barrier-type (SB) npn transistor $Q_3$, resistor element $R_3$ connected between the collector of transistor $Q_3$ and $V_{cc}$ power source, Schottky-barrier-type npn output transistor (the second transistor) $Q_4$ with its base connected to the emitter of phase-splitting SB transistor $Q_3$, resistor element $R_4$ connected between the base of second transistor $Q_4$ and the ground GND, Schottky-barrier-type npn transistor $Q_6$ and npn-type transistor (first transistor) $Q_5$ that form a Darlington connection circuit, collector resistor element $R_5$ connected between the collector of transistor $Q_5$ and $V_{CC}$ power source, and resistor element $R_7$ connected between the base of transistor $Q_5$ and the connection point between the emitter of transistor $Q_5$ and the collector of transistor $Q_4$.

Transistor $Q_5$ and transistor $Q_4$ are connected in totem pole form, and they are turned ON alternately.

The collector of transistor $Q_4$ is connected to a load electrostatic capacitance $C_L$ as the capacitive load, such as CCD or power MOSFET.

Rise characteristics control circuit (20) comprises the following elements: resistor element $R_2$ connected to $V_{CC}$ power source, npn-type first control transistor $Q_2$ with its base connected to said resistor element $R_2$, Schottky-barrier npn-type second control transistor $Q_1$ with its collector connected to the emitter of said first control transistor $Q_2$, rise characteristics adjusting resistor element $R_1$ connected between the emitter of said second control transistor $Q_1$ and the ground potential GND, resistor element $R_6$ connected between the base of said second control transistor $Q_1$ and the ground potential GND, coupling capacitor $C_1$ connected between the base of second control transistor $Q_1$ and resistor element $R_7$, as well as diode $D_1$ and diode $D_2$ connected in series between the base of first control transistor $Q_2$ and ground potential GND.

It is preferred that said totem-pole-type load driving circuit 10 and rise characteristics control circuit 20 be formed integrally on a single semiconductor substrate, and load driving circuit 1 be provided as a power IC chip.

The basic operation of totem-pole-type load driving circuit 10 is as follows.

When phase-splitting transistor $Q_3$ is turned ON, transistor $Q_4$ is turned ON. However, as the base potential of transistor $Q_6$ in the Darlington connection circuit is on the "low level," transistor $Q_6$ remains in the OFF state, and transistor $Q_5$ is also in the OFF state.

In this case, discharge takes place from load electrostatic capacitance $C_L$ to ground potential GND through transistor $Q_4$.

When phase-splitting transistor $Q_3$ is turned OFF, transistor $Q_4$ is also turned OFF. However, as the collector potential of phase-splitting transistor $Q_3$ is on the "high level," transistor $Q_6$ of the Darlington connection circuit is turned ON, and transistor $Q_5$ is turned ON.

In this case, $V_{CC}$ power source is connected through resistor element $R_5$ and transistor $Q_5$ to load electrostatic capacitance $C_L$, and load electrostatic capacitance $C_L$ is charged.

In this way, by means of phase-splitting transistor $Q_3$, opposite operations are executed by transistor $Q_5$ and transistor $Q_4$ connected in the totem pole configuration.

As explained in the above, under the condition when the electrostatic capacitance value is as large as in the range of 500–2000 pF for load electrostatic capacitance $C_L$, in order to shorten the charging time and discharging time for load electrostatic capacitance $C_L$, the rise time $t_r$ and the drop time $t_d$ of said totem-pole-type load driving circuit 10 are set to be short.

That is, pull-up resistance $R_{UP}$ defined by the sum of resistor element $R_5$ and the equivalent resistance value of transistor $Q_5$ and the pull-down resistance $R_{LOW}$ defined by the equivalent resistance value of transistor $Q_4$ are made smaller.

However, when load electrostatic capacitance $C_L$ enters the no-load state or "0" load state, that is, when the load electrostatic capacitance becomes very small, the rise characteristic curve becomes very steep, the sustain voltage of the transistor is decreased, causing the aforementioned breakdown phenomenon, with a large current flowing from the $V_{CC}$ power source to transistors $Q_5$ and $Q_4$, which may finally be damaged.

The aforementioned breakdown phenomenon can be prevented by using rise characteristics control circuit 20. In the following, the operation of rise characteristics control circuit 20 will be explained.

When rise time $t_r$ is short, a current flows by coupling capacitor $C_1$ to the base of second control transistor $Q_1$ so that second control transistor $Q_1$ is turned ON, and first control transistor $Q_2$ is also turned ON.

A constant-current circuit is made of resistor element $R_2$, diode $D_1$, diode $D_2$, first control transistor $Q_2$, second control transistor $Q_1$, and resistor element $R_1$. The following collector current $IC_2$ flows into the collector of first control transistor $Q_2$:

$$IC_2 = (V_{BE} - V_{CESATQ1})/R_1 \quad \ldots (1)$$

where, $V_{BE}$ represents the voltage between the base and emitter of first control transistor $Q_2$;

$V_{CESATQ1}$ represents the saturated voltage between the collector and emitter of second control transistor $Q_1$;

and $R_1$ represents the resistance of resistor element $R_1$.

The base potential of first control transistor $Q_2$ is represented by the sum of the forward voltage drop of diode $D_1$, and that of diode $D_2$, or by the sum of the base-emitter voltage of first control transistor $Q_2$, the saturated voltage between collector and emitter of second control transistor $Q_1$, and the voltage between the two ends of resistor element $R_1$. Here, as the base-emitter voltage of first control transistor $Q_2$ is equal to the forward voltage drop of diode $D_1$ or that of diode $D_2$, the voltage on the two ends of resistor element $R_1$ can be represented by the difference between the forward voltage drop of diode $D_2$ and the saturated collector-emitter voltage of second control transistor $Q_1$, and formula 1 is established.

When Schottky barrier second control transistor $Q_1$ is turned ON, the saturated voltage between its collector and emitter is about 0.2 V. On the other hand, the voltage between base and emitter of first control transistor $Q_2$, and the forward voltage drops of diode $D_1$ and $D_2$ are about 0.7 V, respectively. Consequently, the collector current $IC_2$ of first control transistor $Q_2$ is about 0.5 V/R1.

Collector current $IC_2$ of said first control transistor $Q_2$ is reduced by the current flowing into the collector of phase-splitting transistor $Q_3$; as a result, the rise time of the collector potential of phase-splitting transistor $Q_3$ is delayed. Consequently, the operation of the Darlington connection circuit is delayed, load current $I_{CL}$ flowing into load electrostatic capacitance $C_L$ is reduced, and the rise of totem-pole-type load driving circuit 10 is slowed down.

That is, rise time $t_r$ is prolonged, and the sustain voltage of transistor $Q_4$ is not decreased. As a result, in the state when load driving circuit 1 is set appropriately to enable high-speed operation for a large value of load electrostatic capacitance $C_L$, even when load electrostatic capacitance $C_L$ is reduced, there is still no breakdown phenomenon, and damage of transistor $Q_4$ and transistor $Q_5$ can be prevented.

The aforementioned operation may be explained in more detail with reference to the characteristics diagram shown in FIG. 2.

Curve IN shows the variation in the input signal of the totem-pole-type load driving circuit, that is, variation in the output control signal. Curves CV1, CV2, and CV3 show the variation in the output signal of the totem-pole-type load driving circuit. The abscissa represents time, while the ordinate represents voltage. $V_{TH}$ represents the threshold input voltage of the load circuit connected to the totem-pole-type load driving circuit, and $BV_{CEO}$ represent the base-open collector yield voltage of the totem-pole-type load driving circuit.

CV2 represents the rise characteristics of the output signal of the totem-pole-type load driving circuit when the load electrostatic capacitance $C_L$ is large, that is, when the largest load applies. CV3 represents the rise characteristics of the output signal of the totem-pole-type load driving circuit with no load. For rise characteristics CV3, as the rise curve is too steep, the sustain voltage of the transistor is decreased, causing the breakdown phenomenon, or even damage to transistor $Q_4$ and transistor $Q_5$.

As pointed out in the above, in order to prevent this breakdown phenomenon, the sustain voltage of the transistor is raised, that is, base-open collector yield voltage $BV_{CEO}$ is raised to higher than the voltage of $V_{CC}$. For this purpose, in the conventional scheme, the thickness of the epitaxial layer formed on the semiconductor substrate is increased. However, as the epitaxial layer becomes thicker, various problems take place as pointed out in the above.

According to this invention, with the aid of the rise characteristics control circuit, the rise characteristics CV3 in the case of no load are forcibly changed to CV2, so that the sustain voltage of the transistor is raised, and the breakdown phenomenon can be prevented. In addition, as the rise characteristic curve in case of no load remains as CV3 before the input threshold voltage $V_{TH}$ of the load circuit is reached, while the rise characteristics control circuit is set in operation and the rise characteristic curve is changed to CV1 when the threshold voltage $V_{TH}$ is crossed. In this way, high-speed operation with no load and prevention of the breakdown phenomenon can be realized at the same time.

Figure 2:
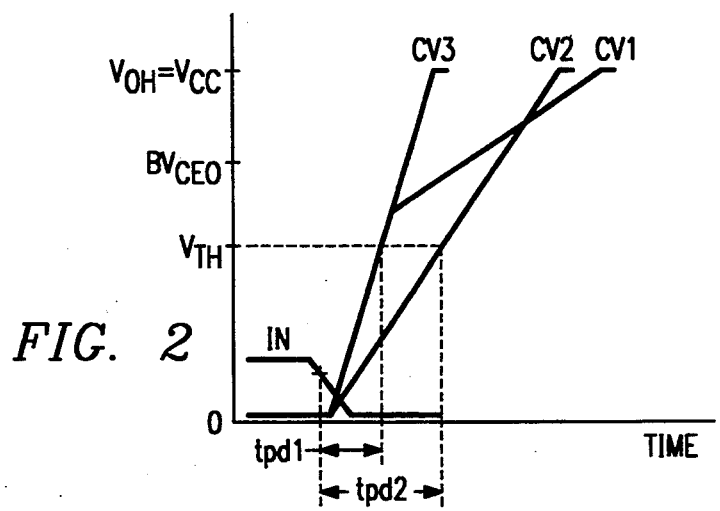
FIG. 2 is a diagram illustrating the operation characteristics of the totem-pole-type load driving circuit shown in FIG. 1.

For load driving circuit 1 in the embodiment of this invention shown in FIG. 1, when the load electrostatic capacitance of the load circuit is small, before the input threshold voltage $V_{TH}$ Of the load circuit is reached, with the aid of the operation of totem-pole-type load driving circuit 10, the operation is performed according to curve CV3 in FIG. 2 in the same way as in the conventional totem-pole-type load driving circuit. As soon as the input threshold voltage $V_{TH}$ of the load circuit is crossed, rise characteristics control circuit 20 acts, and the operation occurs according to that which is represented by curve CV1. However, curve CV1 and curve CV3 have the same delay time $t_{pd}$. When load electrostatic capacitance $C_L$ is small, the operation takes the track of this curve CV1. If load electrostatic capacitance $C_L$ is large, the operation becomes represented by curve CV2. In this case, there is no decrease in the sustain voltage, and the breakdown phenomenon does not take place.

When the value of load electrostatic capacitance $C_L$ is small, if input threshold voltage $V_{TH}$ of the load circuit is crossed, the operation becomes represented by curve CV1, and a high sustained voltage can be obtained while a short delay time $t_{pdl}$ [sic] can be guaranteed. In other words, the state is equivalent to that in which the base-open collector yield voltage $BV_{CEO}$ becomes higher than the voltage of $V_{CC}$.

By using load driving circuit 1 shown in FIG. 1, high-speed operation can be realized for a large load electrostatic capacitance $C_L$; and, even when the load electrostatic capacitance $C_L$ becomes smaller, the high-speed operation of load electrostatic capacitance $C_L$ can be maintained while a decrease in the sustained voltage can be prevented, and the breakdown phenomenon can be prevented.

The slope of the rise characteristic curves, such as curve CV1, etc., is defined by the value of adjustable resistor element $R_1$ and the value of coupling capacitor $C_1$ within characteristics control circuit 20. That is, by setting appropriate values for resistor element $R_1$ and coupling capacitor $C_1$, the desired slope, that is, the desired delay time $t_{pd}$, can be realized.

Figure 3:
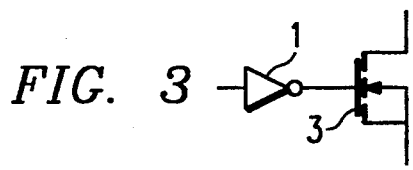
FIG. 3 is a circuit diagram illustrating an embodiment of the load driving circuit of this invention.
Figure 4:
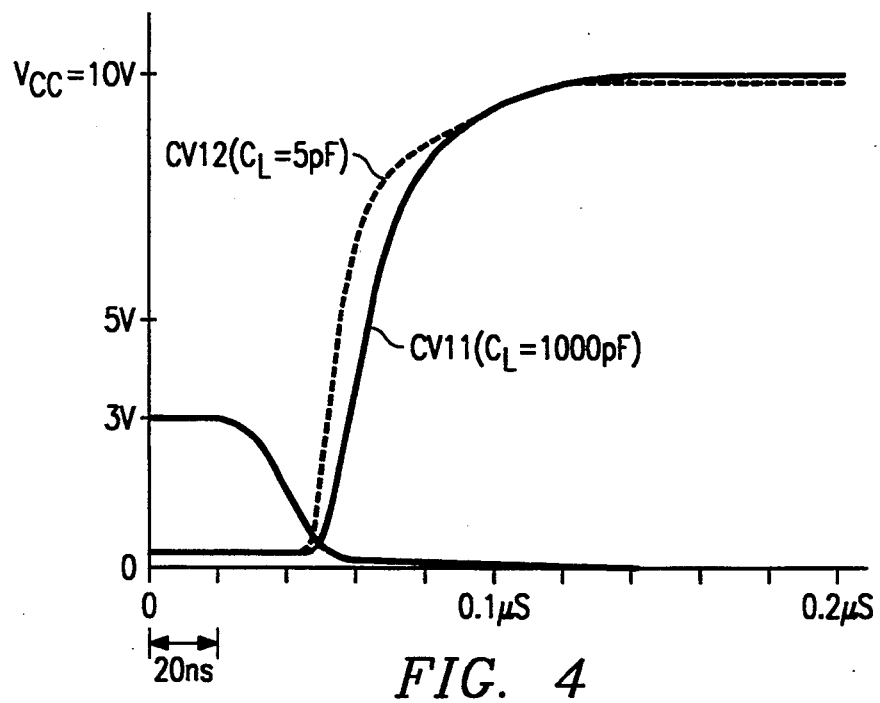
FIG. 4 is a rise characteristics diagram of a conventional totem-pole-type load driving circuit.
Figure 5:
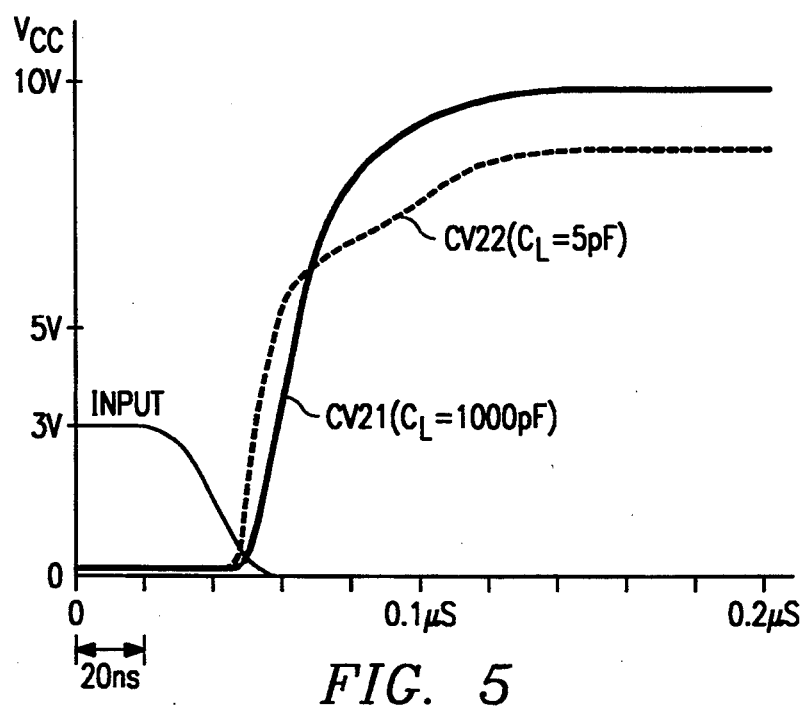
FIG. 5 is a rise characteristics diagram of the totem-pole-type load driving circuit in the embodiment of the load driving circuit of this invention.

FIGS. 4 and 5 show the more specific characteristic curves of the conventional totem-pole-type load driving circuit and load driving circuit 1 shown in FIG. 1, respectively. In this case, power MOSFET 3 used as load electrostatic capacitance $C_L$ shown in FIG. 3 is driven by load driving circuit (1) shown in FIG. 1; power MOSFET 3 is driven by the totem-pole-type load driving circuit shown in FIG. 8.

In FIG. 4, curves CV11 and CV12 show the simulation results of the conventional totem-pole-type load driving circuit shown in FIG. 8 in the case when load electrostatic capacitance $C_L$ is of the rated value of 1000 pF and in the case when load electrostatic capacitance $C_L$ has a low load value of 5 pF, respectively.

On the other hand, in FIG. 5, curves CV21 and CV22 show the simulation results of load driving circuit 1 shown in FIG. 1 in the case when load electrostatic capacitance $C_L$ is of the rated value of 1000 pF and in the case when load electrostatic capacitance $C_L$ has a low load value of 5 pF, respectively.

In both cases, the $V_{CC}$ voltage is 10 V.

As can be seen from curve CV21 in FIG. 5, when load electrostatic capacitance $C_L$ is large, rise characteristics control circuit 20 does not work, and a rise characteristic curve corresponding to the load electrostatic capacitance is obtained. On the other hand, as shown by curve CV22, when load electrostatic capacitance $C_L$ is small, with the aid of totem-pole-type load driving circuit 10, high-speed operation is carried out up to the input threshold voltage $V_{TH}$ of the load circuit, namely, power MOSFET 3. Then, rise characteristics control circuit 20 acts, and the rise characteristic curve becomes less steep. That is, by means of load driving circuit 1 shown in FIG. 1, both high-speed operation in the desired range and maintenance of a high sustained voltage can be realized.

On the other hand, in the totem-pole-type load driving circuit shown in FIG. 8, curve CV12 for a smaller load electrostatic capacitance $C_L$ shows higher speed characteristics than curve CV11 for a large load electrostatic capacitance $C_L$, and the sustained voltage decreases and the breakdown phenomenon takes place for the transistors.

As curve CV12 in FIG. 4 is compared with curve CV22 in FIG. 5, it can be seen that rise characteristics control circuit 20 can display a significant effect in preventing decrease in the sustain voltage.

In the device design of semiconductor elements used for driving the load, the voltage rating is the most important parameter to be considered. Usually, the base-open collector yield voltage $BV_{CEO}$ is designed to be higher than the voltage of $V_{CC}$, or, base-open collector yield voltage $BV_{CEO}$ is set higher than the highest voltage applied. When the voltage rating is insufficient for the existing process with respect to the demanded specifications, the thickness of the epitaxial layer may be changed to meet the demand. Consequently, a long time and several man hours are needed to determine the design rules.

However, as explained in the above, in the embodiment of this invention, it is possible to compensate for the insufficient thickness of the epitaxial layer.

In addition, when the epitaxial layer is formed with a small thickness, the chip size can be reduced, this is beneficial for realizing a low cost, high speed of operation, and reduction in power consumption.

Figure 6:
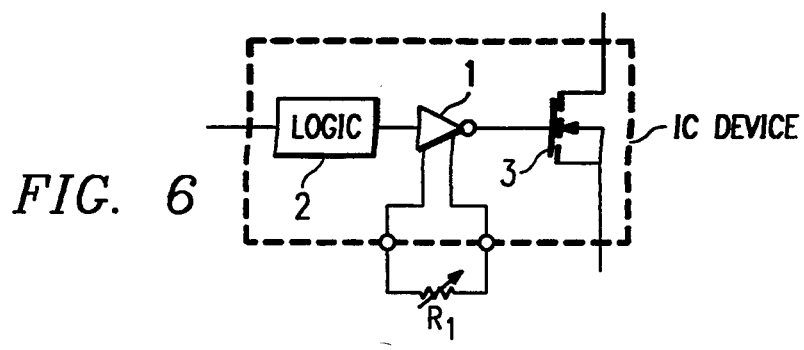
FIG. 6 is a circuit diagram illustrating another embodiment of the load driving circuit of this invention.

FIG. 6 shows a circuit configuration of the power device with consideration made on making the element more intelligent and smarter as required by the recent trend of development.

When power MOSFET 3 is driven by load driving circuit 1 shown in FIG. 1, control logic circuit 2 having bipolar transistor for controlling load driving circuit 1 is also formed integrally on the same semiconductor substrate.

As explained in the above, in this embodiment, it is possible to reduce the thickness of the epitaxial layer, and to reduce the size of the semiconductor device. Consequently, control logic circuit 2 having bipolar transistor can be formed on the same semiconductor substrate as load driving circuit 1. As a result, the overall dimensions can be reduced, and power MOSFET 3 can perform a high-speed operation as a single unit.

Adjustable resistor element $R_1$ within rise characteristics control circuit 20 shown in FIG. 1 is used in adjusting the rise characteristics of load driving circuit 1 so that the characteristic value is preferably adjusted to be over the input threshold voltage $V_{TH}$ of the load circuit. However, when it is incorporated into the semiconductor device, it is difficult for the user to set the desired value as needed by the specific application.

In FIG. 6, the configuration is changed to have it attached as an external resistor element $R_1$ on the IC device. As a result, the user can make adjustments of the characteristics according to the specific applications.

Figure 7:
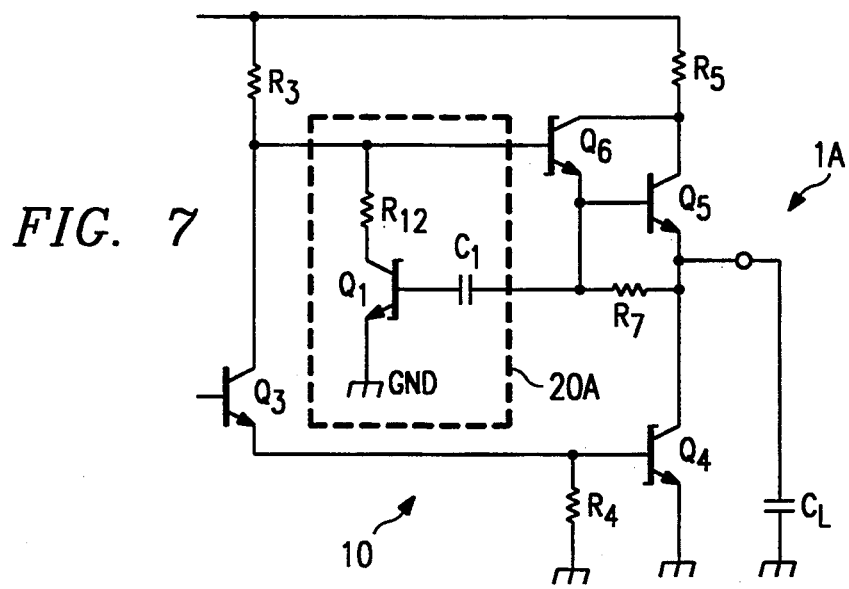
FIG. 7 is a circuit diagram of the load driving circuit as a second embodiment of the load driving circuit of this invention.

FIG. 7 shows the load driving circuit in a second embodiment of the load driving circuit of this invention. For load driving circuit 1A shown in FIG. 7, rise characteristics control circuit 20A is simplified as compared with rise characteristics control circuit 20 in FIG. 1.

When FIG. 7 is compared with FIG. 1, it can be seen that in rise characteristics control circuit 20A, first control transistor $Q_2$, diode $D_1$, diode $D_2$ and resistor element $R_2$ in rise characteristics control circuit 20 are deleted, and resistor element $R_{12}$ is used instead of resistor element $R_1$. Just as resistor element $R_{12}$, this resistor element $R_{11}$ also plays the function of an adjustable resistor element.

Rise characteristics control circuit 20A shown in FIG. 7 performs the same operation as rise characteristics control circuit 20 shown in FIG. 1. However, a current always flows in the constant-current circuit in rise characteristics control circuit 20 shown in FIG. 1. In the rise characteristics control circuit 20A shown in FIG. 7, current does not flow when the control transistor $Q_1$ is in the OFF state so as to reduce the power consumption. Of course, it is rather difficult to perform an adjustment for rise characteristics control circuit 20A.

In the above, this invention has been explained with reference to the appropriate embodiments of the load driving circuit in the form of totem-pole-type load driving circuit. However, implementation of this invention is not limited to the totem-pole-type load driving circuit. Various other types of load driving circuit may be used as long as the first and second transistors perform opposite operations in the configuration, and the capacitive load connected to the connection point between them may make various changes.

In the aforementioned embodiments, transistor $Q_5$ forms a configuration of Darlington connection circuit. However, implementation of this invention is not limited to the Darlington connection circuit, a single transistor may be used as well.

As explained in the above, according to this invention, for the load, in particular, a capacitive load with variation between a large value and a small value, the high-speed operation can be ensured when the load is high; on the other hand, when the load is low, the rise characteristics are tempered so that a high sustained voltage of the transistor can be maintained, the breakdown phenomenon can be prevented, and the obtained load driving circuit has a high reliability as damages of the transistors can be prevented.

In addition, in the case when the load electrostatic capacitance is low, by tempering the rise characteristics when the input threshold of the load circuit is crossed, the high-speed operation and prevention of decrease in the sustained voltage of the transistor can be realized at the same time.

It is preferred that the load driving circuit of this invention be formed integrally as a single body. When the output transistor is formed, a high voltage rating can be realized even for a thin epitaxial layer, and the dimensions of the device with the load driving circuit of this invention can be made smaller.

In the load driving circuit of this invention, the value of the adjustable resistor element in the rise characteristics control circuit can be adjusted from the outside as [the resistor element] is set outside the device. In this way, the sustained voltage adjusting voltage can be adjusted from the outside, and the adjustment can be performed by the user according to the specific applications.

I claim:

1. A load driving circuit comprising:
    a totem-pole output circuit including
        a first pull-up transistor for connection to a power source and having a control gate for receiving an input signal to render said first transistor conductive, and
        a second pull-down transistor for connection to ground potential and having a control gate for receiving a controlled input signal to render said second transistor conductive;
    a connection node between said first transistor and said second transistor;
    a rise characteristics control circuit including
        a coupling capacitor connected to the connection node between said first transistor and said second transistor, and
        a constant-current circuit connected to the control gates of said first and second transistors for dampening the rise in potential at the connection node between said first transistor and said second transistor in response to current from said coupling capacitor by increasing the turn-on time of said first transistor when the rise in potential at the connection node between said first transistor and said second transistor exceeds a predetermined threshold level;
    the constant-current circuit of said rise characteristics control circuit further controlling the magnitude of the controlled input signal to the control gate of said second transistor to regulate the operation of said second transistor between non-conductive and conductive states.

2. A load driving circuit as set forth in claim 1 wherein said constant-current circuit of said rise characteristics control circuit includes
    a first control transistor connected to the control gate of said first transistor;
    a second control transistor connected in series to said first control transistor and having a control gate connected to said coupling capacitor;
    an adjustable resistor element connected between said second control transistor and ground potential and having a resistance defining the rise characteristics relating to the connection node between said first transistor and said second transistor of said totem-pole output circuit; and a diode circuit connected between the control gate of said first control transistor and ground potential.

3. A load driving circuit as set forth in claim 2, wherein said first control transistor is a bipolar transistor;

said second control transistor is a Schottky-barrier-type bipolar transistor.

4. A load driving circuit as set forth in claim 1, further including a phase-splitting transistor for connection to the power source and having a control gate for receiving the input signal, said phase-splitting transistor being connected to the control gates of first and second transistors for providing the input signal to the control gate of said first transistor when non-conductive and providing the controlled input signal to the control gate of said second transistor when conductive so as to enable reverse operation of said first transistor and said second transistor.

5. A load driving circuit as set forth in claim 4, wherein said first transistor is a bipolar transistor, and further including a third transistor connected to said first transistor in a Darlington connection and having a control gate connected to said phase-splitting transistor;

said phase-splitting transistor being operative to control the turn-on of said third transistor to a conductive state; and said second transistor being a Schottky-barrier-type bipolar transistor.

6. A load driving circuit as set forth in claim 1, wherein said constant-current circuit comprises a control transistor connected to the control gate of said first transistor and to ground potential and having a control gate connected to said coupling capacitor.

* * * * *